July 30, 1968 W. G. ANSLEY 3,395,320
ISOLATION TECHNIQUE FOR INTEGRATED CIRCUIT STRUCTURE
Filed Aug. 25, 1965
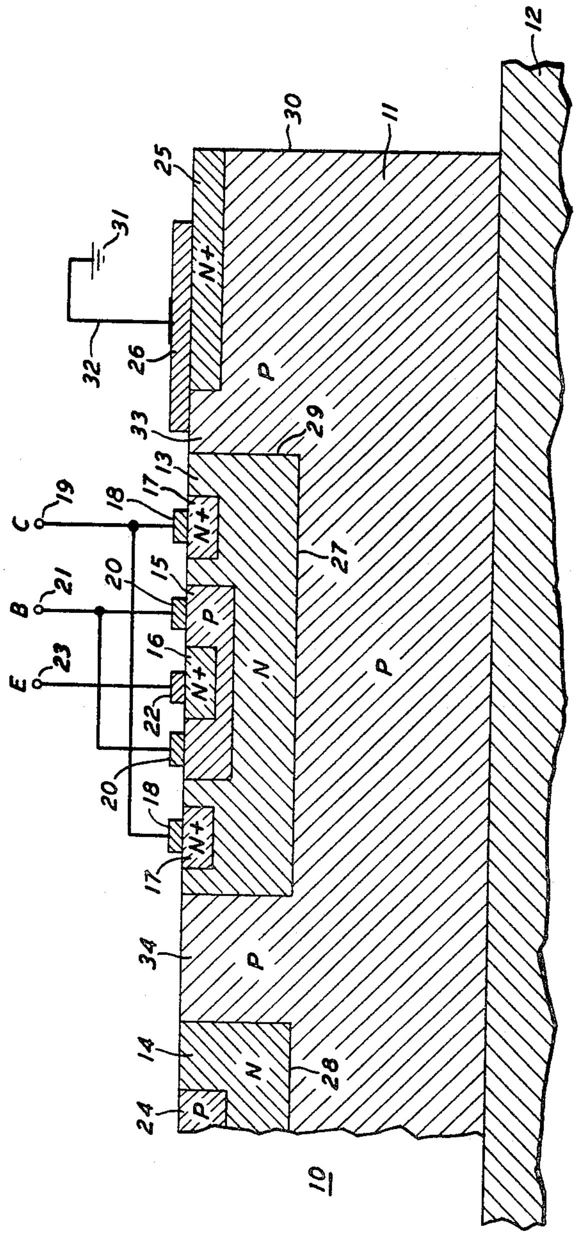
INVENTOR
W. G. ANSLEY
BY H W Lockhart
ATTORNEY

United States Patent Office 3,395,320
Patented July 30, 1968

3,395,320

ISOLATION TECHNIQUE FOR INTEGRATED CIRCUIT STRUCTURE

William G. Ansley, Mountain View, Calif., assignor to Bell Telephone Laboratories, Incorporated, New York, N.Y., a corporation of New York Filed Aug. 25, 1965, Ser. No. 482,481
3 Claims. (Cl. 317—234)

ABSTRACT OF THE DISCLOSURE

A peripheral zone of low resistivity and of opposite conductivity type to that of the bulk of a semiconductor integrated circuit body is provided on the surface of the body. This zone is electrically connected by low resistance paths, both to the adjoining isolation zones and to true electrical ground, thereby enhancing the high frequency performance of the circuit by reducing interzone capacitance and its associated charge.

This invention relates to semiconductive apparatus and, more particularly, to semiconductor integrated circuits of the kind in which a plurality of semiconductive components are integrated in a monolithic slice of semiconductor material.

In integrated circuits of this type electrical isolation between individual components is achieved by the interposition of reverse-biased PN junctions. With PN junctions used as isolation, an appreciable amount of capacitance exists between the individual semiconductive components and the substrate semiconductor material in which the separate components have been formed. The presence of this capacitance and its charge tends to deteriorate the performance of high frequency circuit components.

An object of the present invention is to reduce the effect on high frequency performance of the PN junctions used for isolation in a relatively simple fashion with little additional processing.

In one general aspect, the invention invloves a peripheral zone of low resistivity on the surface of the integrated circuit which is electrically connected both to true ground and adjoining isolation zones. In particular, deposited metal straps interconnect the isolation zone and the low resistance zone conveniently at locations which do not interfere with interconnections of the integrated circuit.

It is a feature of the invention that the low resistance peripheral zone is produced during a standard diffusion step of the integrated circuit fabrication, and thus does not add an additional step to the process.

The invention and its other objects and features will be understood more clearly from the following description of a specific embodiment, illustrated by the drawing which shows, in section, a portion of a semiconductor integrated circuit.

Referring to the drawing, the portion 10 of the integrated device shows an edge or perimeter 30 of the wafer which comprises the P-type conductivity substrate 11 mounted and attached to the platform 12. N-type conductivity zones 13 and 14 are terminal zones of individual semiconductive components, a transistor and diode, respectively. P-type conductivity zone 24 forms the other zone of the PN junction diode, the cross-section of which is not completely shown. The transistor comprises also the P-type base zone 15 and N+ conductivity zone 16 forming the emitter. N+ zones 17 and 18 provide enhanced low resistance contact to the collector zone 13 and electrodes 18—18, 20—20 and 22 are collector, base and emitter connections to terminals 19, 21 and 23 respectively. In this context N+ designates very low resistivity material generally having a net impurity concentration in excess of about $10^{19}$ atoms per cubic centimeter.

Between and defined by the P-type substrate and N-type islands 13 and 14 within which the semiconductive components are formed, are the PN junctions 27 and 28, respectively. These isolation junctions are reverse-biased at varying levels during normal operation of the circuit. Changes in this bias level are reflected in changes in the PN junction capacitance. Delay in movement of the charge associated with this capacitance, particularly that of the sidewall portion 29 of the isolation PN junction, adversely affects the frequency response.

Accordingly, a low resistance path to true ground is provided by way of an N+ zone 25 which encompasses the periphery of the integrated circuit wafer. Connections between the P-type isolation zone 11 and the N+ peripheral zone 25 are provided by short metal interconnections 26, only one of which is shown in the drawing. However, a number of such interconnecting straps are provided in convenient locations to ensure adequate low resistance paths for charge movement. Moreover, the interconnecting straps may be located so as not to interfere with other interconnections provided on the surface of the wafer leading from the terminals of individual components to the perimeter of the wafer. The low resistivity peripheral zone 25 is connected to ground 31 by way of lead 32 typically from a metallized portion 26 to the header on which the monolith is mounted.

One procedure for fabricating the subject device comprises preparing a slice of P-type conductivity silicon having a resistivity of about 10 ohm-centimeters and a thickness of about 6 mils. An N-type film is formed by epitaxial deposition on one surface of the slice to a thickness of about 8 microns and a resistivity of about 0.1 to 2.0 ohm-centimeters.

Using an oxide mask formed by well-known photoresist techniques the P-type isolation zones 33 and 34 are made by solid state diffusion from the epitaxial layer surface. After reforming the oxide masks for each successive diffusion, first the P-type zones 15 and 24 are made, followed by the N+ zones 16, 17, 18 and 25. In particular, it is advantageous to form the low resistance peripheral zone 25 during one of the regular diffusion steps, in this case, the emitter diffusion. This diffusion typically produces a peripheral zone 25 having a sheet resistance of about two ohms per square. In this instance it is evident that only a simple modification of the procedure for forming the oxide mask is needed to enable the emitter diffusion process to produce also the low resistivity zone 25. Finally, the interconnections are formed on the semiconductor wafer surface by suitable masked metal deposition likewise in accordance with well-known techniques. Advantageously, the low resistivity peripheral zone 25 is connected to the header 12 by thermo-compression bonded wire. Alternatively it may be practicable, in some circumstances, to use deposited metal interconnections to connect zone 25 to ground. This connection is indicated diagrammatically by the lead 32 and the manner of its accomplishment is not critical to this invention.

In an alternative procedure, the P-type isolation zones 33 and 34 between the semiconductive components may be made by predeposition and diffusion of a suitable significant impurity prior to growing the N-type epitaxial film. Then during such epitaxial growth and subsequent diffusion heat treatments, diffusion of this impurity occurs upward from the original substrate surface to meet a P-type diffusion moving downward to produce the isolating P-type zones. In particular, the P-type diffusion from the top surface, in either of the foregoing described procedures, may be done with the P-type base diffusion.

Although the invention has been described in terms of a specific embodiment it will be understood that other arrangements may be devised by those skilled in the art, which likewise will be within the scope and spirit of the invention. For example, the integrated circuit may be fabricated with the zones of opposite conductivity type to that described although the foregoing described embodiment presently is preferred. Moreover, the low resistivity peripheral zone may be of P+ conductivity as well, if convenience in fabrication so recommends. Also, in addition to silicon, which is the presently preferred material for monolithic integrated circuit devices, germanium, the Group II–Group VI and Group III–Group V semiconductor compounds may be used with this invention.

What is claimed is:

1. A semiconductor integrated circuit comprising a body of semiconductor material predominantly of one conductivity type, said body including a plurality of individual semiconductive components adjacent one major surface of said body, isolating zones of said one conductivity type between said individual components, a peripheral zone of opposite conductivity type adjacent said one surface defining with the adjoining isolating zone a PN junction, first low resistance means on said one surface interconnecting said isolating zones and said peripheral zone, and second means directly connecting said peripheral zone to ground.

2. A semiconductor integrated circuit comprising a body of semiconductor material predominantly of P-type conductivity, said body including a plurality of individual semiconductive components adjacent one major surface of said body, isolating zones of P-type conductivity between said individual components, a peripheral zone of N-type conductivity adjacent said one surface and substantially bounding the perimeter of said body and defining with the adjoining isolating zone a PN junction, first low resistance means on said one surface electrically connecting said isolating zones to said peripheral zone, and second means directly connecting said peripheral zone to ground.

3. A semiconductor integrated circuit in accordance with claim 2 in which the semiconductor material is selected from the group consisting of germanium, silicon, the Group II–Group VI and the Group III–Group V semiconductor components.

References Cited

UNITED STATES PATENTS

| | | | |
|---|---|---|---|
| 2,938,130 | 5/1960 | Noll | 307—88.5 |
| 3,029,366 | 4/1962 | Lehovec | 317—101 |
| 3,035,186 | 5/1962 | Doucette | 307—88.5 |

JOHN W. HUCKERT, *Primary Examiner.*

R. F. SANDLER, *Assistant Examiner.*